US009843328B1

(12) United States Patent
Xiao

(10) Patent No.: US 9,843,328 B1
(45) Date of Patent: *Dec. 12, 2017

(54) 3D FIELD PROGRAMMABLE GATE ARRAY SYSTEM WITH RESET MANAGEMENT AND METHOD OF MANUFACTURE THEREOF

(71) Applicant: Altera Corporation, San Jose, CA (US)

(72) Inventor: Ping Xiao, East Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/173,507

(22) Filed: Jun. 3, 2016

Related U.S. Application Data

(63) Continuation of application No. 14/470,901, filed on Aug. 27, 2014, now Pat. No. 9,374,094.

(51) Int. Cl.
| | | |
|---|---|---|
| *H03K 19/017* | (2006.01) | |
| *H03K 19/177* | (2006.01) | |
| *H01L 25/18* | (2006.01) | |
| *H01L 23/00* | (2006.01) | |
| *H01L 23/498* | (2006.01) | |
| *H01L 25/065* | (2006.01) | |

(52) U.S. Cl.
CPC ... *H03K 19/1774* (2013.01); *H01L 23/49827* (2013.01); *H01L 24/17* (2013.01); *H01L 25/0655* (2013.01); *H01L 25/18* (2013.01); *H03K 19/17708* (2013.01); *H01L 2224/16155* (2013.01); *H01L 2924/1431* (2013.01); *H01L 2924/15311* (2013.01)

(58) Field of Classification Search
CPC ..... H01L 25/16; H03K 19/0175; H03K 19/08
See application file for complete search history.

(56) References Cited

U.S. PATENT DOCUMENTS

| | | | |
|---|---|---|---|
| 5,559,450 A | 9/1996 | Ngai et al. | |
| 5,600,584 A | 2/1997 | Gilson | |
| 5,760,624 A * | 6/1998 | McClintock | H03K 3/356008 327/143 |
| 5,821,787 A * | 10/1998 | McClintock | H03K 17/223 327/143 |
| 6,469,551 B2 * | 10/2002 | Kobayashi | H03K 17/223 327/143 |
| 6,604,228 B1 | 8/2003 | Patel et al. | |
| 7,142,024 B2 * | 11/2006 | Youssef | H03K 3/356008 327/143 |
| 7,750,694 B1 * | 7/2010 | Nguyen | H03K 17/22 327/142 |
| 8,026,739 B2 | 9/2011 | Sullam et al. | |
| 8,987,868 B1 * | 3/2015 | Rahman | H01L 23/525 257/621 |
| 9,374,094 B1 * | 6/2016 | Xiao | H03K 19/08 |

(Continued)

*Primary Examiner* — Alexander H Taningco
*Assistant Examiner* — Kurtis R Bahr

(57) ABSTRACT

A 3D field programmable gate array (FPGA) system, and method of manufacture therefor, includes: a field programmable gate array (FPGA) die having a configurable power on reset (POR) unit; a heterogeneous integrated circuit die coupled to the FPGA die; and a 3D power on reset (POR) output configured by the configurable POR unit for initializing the FPGA die and the heterogeneous integrated circuit die.

16 Claims, 5 Drawing Sheets

(56) References Cited

U.S. PATENT DOCUMENTS

| | | | |
|---|---|---|---|
| 2007/0170267 A1* | 7/2007 | Kang | G06K 19/07749 |
| | | | 235/492 |
| 2009/0309609 A1* | 12/2009 | De Jong | G01R 31/318558 |
| | | | 324/537 |
| 2010/0060331 A1* | 3/2010 | Xiao | G06F 1/24 |
| | | | 327/143 |
| 2012/0098140 A1* | 4/2012 | Bartley | H01L 25/0657 |
| | | | 257/774 |
| 2012/0112776 A1* | 5/2012 | Cher | G01R 31/287 |
| | | | 324/750.05 |
| 2014/0103959 A1* | 4/2014 | Andreev | H03K 19/018585 |
| | | | 326/41 |
| 2014/0105246 A1 | 4/2014 | Andreev et al. | |
| 2015/0052622 A1* | 2/2015 | Cabler | G06F 21/558 |
| | | | 726/34 |

\* cited by examiner

3D FIELD PROGRAMMABLE GATE ARRAY SYSTEM WITH RESET MANAGEMENT AND METHOD OF MANUFACTURE THEREOF

This application is a continuation of U.S. patent application Ser. No. 14/470,901, filed Aug. 27, 2014, which is hereby incorporated by reference herein in its entirety. This application claims the benefit of and claims priority to U.S. patent application Ser. No. 14/470,901, filed Aug. 27, 2014.

TECHNICAL FIELD

The present invention relates generally to a system in package system, and more particularly to a system for field programmable gate array system integration.

BACKGROUND ART

The proliferation of configurable electronic devices continues to expand. The development of system in package (SIP) devices has advanced the development of smart phones, tablet computers, robotic applications, vending machines, and much more. The combination of functions within a SIP can be problematic as the electrical and timing requirements of the combined functions can be different.

As SIP applications are expanding, difficulties in initialization of these devices have been exposed. A careful coordination of the initialization timing within the SIP can create extremely difficult problems to solve in the field. In some extreme cases, the flexibility of the SIP is limited by the configuration required to perform the initialization timing.

The configuration can be much more complicated when the control device is implemented by a field programmable gate array (FPGA), which has its own complicated initialization process. The inclusion of an FPGA as the control device in an electronic system, can cause the initialization process become complicated and unwieldy.

Thus, a need still remains for a 3D FPGA system with reset management. In view of the rapid development of end user products and services, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The embodiments described herein describe methods related to a 3D field programmable gate array (FPGA) system including: mounting a field programmable gate array (FPGA) die having a configurable power on reset (POR) unit; coupling a heterogeneous integrated circuit die to the FPGA die; and configuring a 3D power on reset (POR) output by the configurable POR unit for initializing the FPGA die and the heterogeneous integrated circuit die.

The embodiments described herein describe structures related a 3D FPGA system, including: a field programmable gate array (FPGA) die having a configurable power on reset (POR) unit; a heterogeneous integrated circuit die coupled to the FPGA die; and a 3D power on reset (POR) output configured by the configurable POR unit for initializing the FPGA die and the heterogeneous integrated circuit die.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
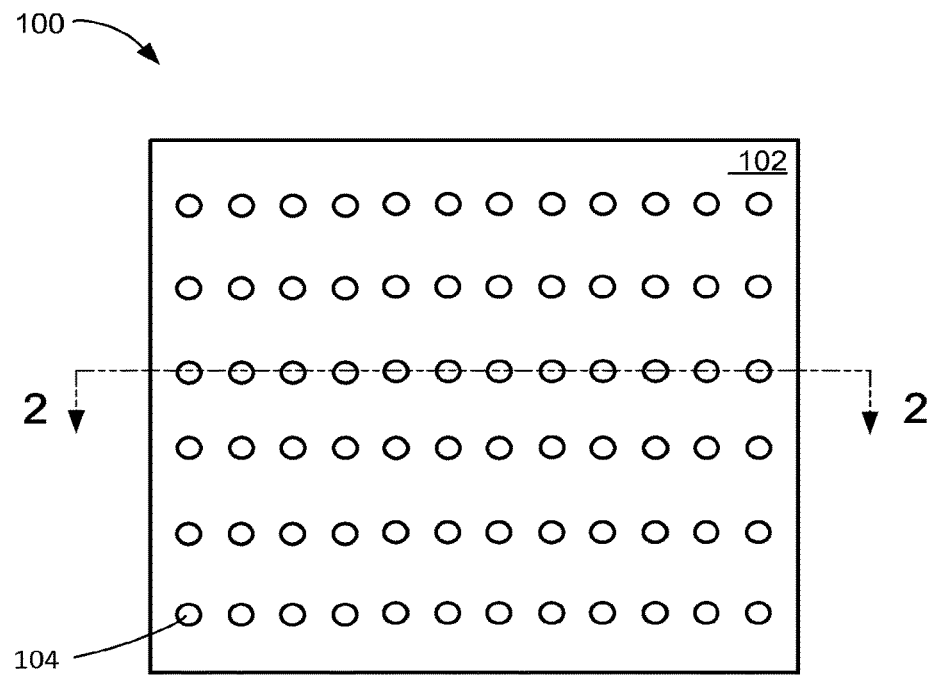
FIG. 1 is a bottom side view of a 3D FPGA system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of the active surface of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between only the elements.

The term "processing" as used herein includes deposition of material or photoresist, patterning, exposure, development, etching, cleaning, and/or removal of the material or photoresist as required in forming a described structure. The term "3D system in package" as used herein includes one or more heterogeneous integrated circuits dice stacked in a vertical direction above a base device. A heterogeneous 3D system in package is defined as a package having multiple integrated circuit dice, with different functions or from different manufacturing processes, integrated in a single stacked device. The heterogeneous 3D system provides a greater degree of optimization than attempting to build the separate functions together on a single chip technology. A heterogeneous 3D FPGA system is defined as a stacked integrated circuit device with integration of a master FPGA die with other separate one or more slave dice of a similar or different technology. The slave dice can include, for example, high bandwidth (HBW) SRAM/DRAM, high speed transceiver, high speed and performance ADC/DAC, ASIC/ASSP, and microprocessor/DSP processor.

The development of field programmable gate array (FPGA) based system in package (SIP) modules can allow rapid development and field updates to quickly support customer demand for new products. This is evident in the game controller market, where new products emerge on a weekly basis.

The emerging field of human support robot development can utilize the FPGA based SIP to implement key support features, such as optical identification, mechanical control, command processing, audio system management, and word recognition. The ability to reconfigure the control functions in these SIP controllers has advanced the development of human support functions at a fantastic rate.

The three dimensional (3D) integration, of control devices with one or more support die, in a single package can require different power schemes, including monitoring power supplies and their levels, power ramping rates and up/down sequences, as well as the critical reset timing in order to reliably turn-on the functions.

Referring now to FIG. 1, therein is shown a bottom side view of a 3D FPGA system 100 in an embodiment of the present invention. The bottom side view of the 3D FPGA system 100 depicts a bottom side redistribution layer 102 having an array of the system interconnects 104 mounted thereon.

It is understood that the number and size of the system interconnects 104 is an example of an embodiment and other configurations of the system interconnects 104 are possible. A section line 2-2 indicates the position and direction of viewing of a cross-section shown in FIG. 2.

Figure 2:
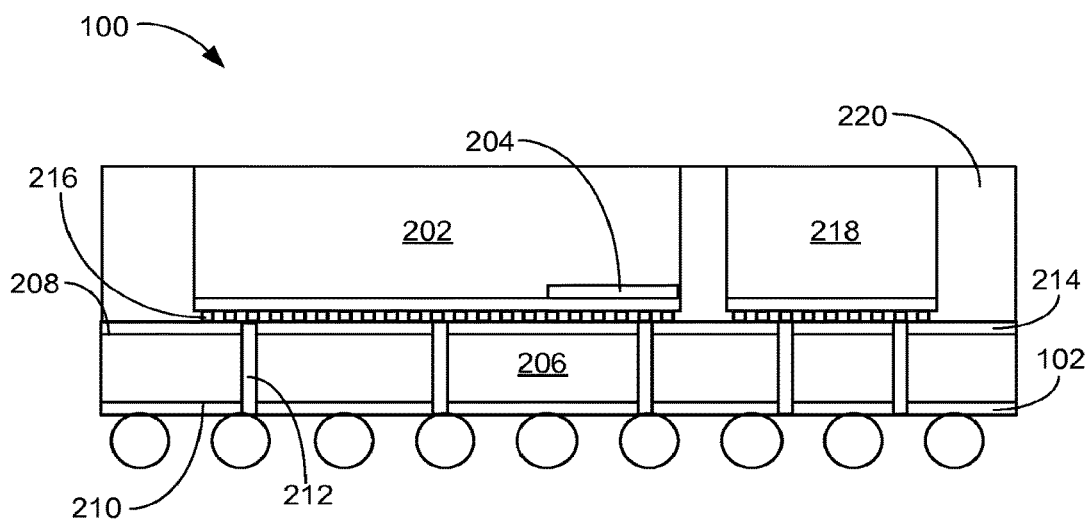
FIG. 2 is a cross-sectional view of the 3D FPGA system along the section line 2-2 of FIG. 1.

Referring now to FIG. 2, therein is shown a cross-sectional view of the 3D FPGA system 100 along the section line 2-2 of FIG. 1. The cross-sectional view of the 3D FPGA system 100 depicts an FPGA die 202, having a configurable power on reset (POR) unit 204, mounted on a base device 206. The base device 206 can be one of a silicon interposer or a heterogeneous integrated circuit. The base device 206 provides electrical connections on an active side 208 and a backside 210 by way of through silicon vias (TSV) 212.

The TSV's 212 can couple between the bottom side redistribution layer 102 and a component side redistribution layer 214. It is understood that the orientation of the active side 208 and the backside 210 is an example and can be reversed without changing embodiments of the present invention.

The FPGA die 202 can be coupled to the component side redistribution layer 214 by micro-bumps 216. The coupling between the FPGA die 202 and a heterogeneous integrated circuit die 218 can be through the micro-bumps 216 and the component side redistribution layer 214. The heterogeneous integrated circuit die 218 is any individual integrated circuit fabricated from the same technology or a different technology from the FPGA die 202. The heterogeneous integrated circuit die 218 can operate as a slave function to the FPGA die 202. The heterogeneous integrated circuit die 218 can provide high speed functions that could not be implemented in the technology of the FPGA die 202.

The configurable power on reset (POR) unit 204 can provide different power schemes, including power supplies and their levels, power reset thresholds for power up/down sequences, as well as the critical reset timing in order to reliably turn-on the functions of the FPGA die 202, the base device 206, and the heterogeneous integrated circuit die 218. The details of the configuration of the configurable power on reset (POR) unit 204 are discussed in subsequent figures.

A package body 220 can optionally be formed on the FPGA die 202, the component side redistribution layer 214, and the heterogeneous integrated circuit die 218. The package body 220 can be formed of an epoxy molding compound, an epoxy resin, silicon sealer, or the like.

It has been discovered that the base device 206 can operate as an additional function operating under the control of the FPGA die 202. The 3D FPGA system 100 can integrate the FPGA die 202 with one or more of the heterogeneous integrated circuit die 218 while providing an extended function under control of the FPGA die 202. The configurable POR unit 204 of the FPGA die 202 can be configured to provide an appropriate 3D heterogeneous power-on-reset (POR) for all of the integrated functions within the 3D FPGA system 100.

Figure 3:
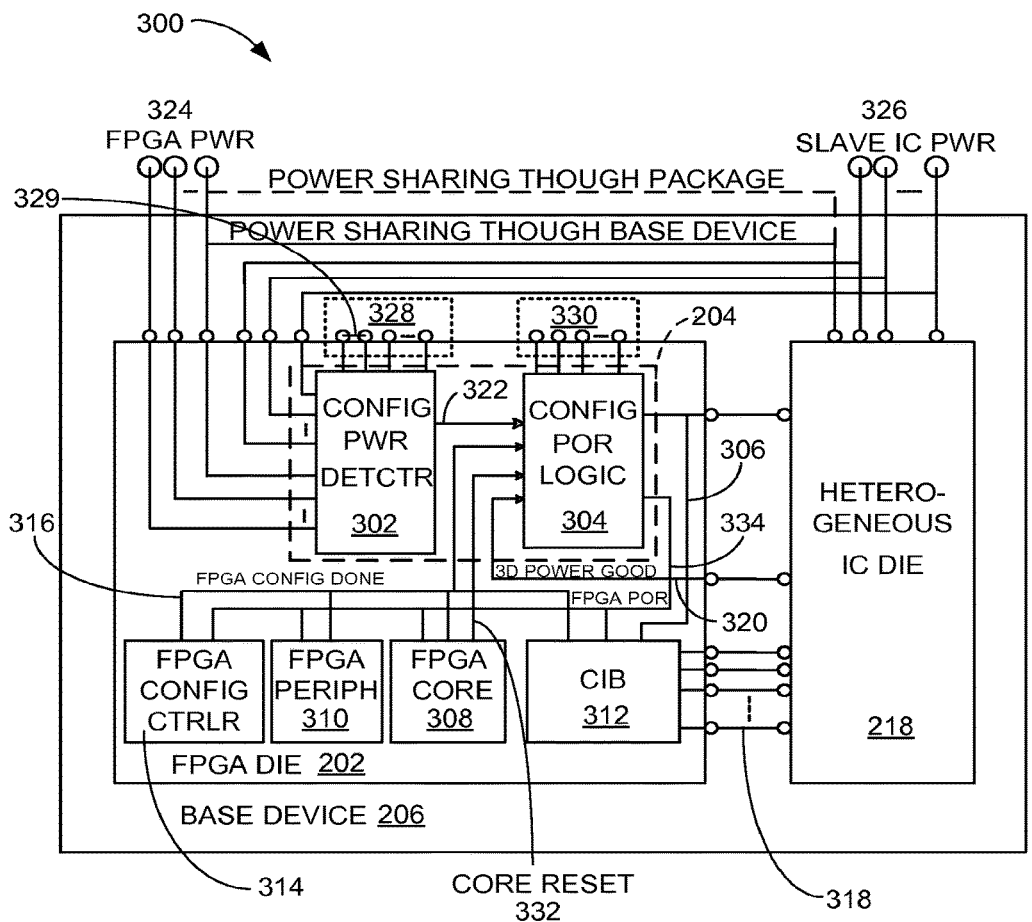
FIG. 3 is a functional block diagram of a 3D FPGA system in an embodiment of the present invention.

Referring now to FIG. 3, therein is shown a functional block diagram of a 3D FPGA system 300 in an embodiment of the present invention. The functional block diagram of the 3D FPGA system 300 depicts the FPGA die 202 mounted to the base device 206. The FPGA die 202 can have the configurable POR unit 204 including a configurable power detector module 302 for monitoring the voltage levels, and reset thresholds of the FPGA die 202 and any of the heterogeneous integrated circuit die 218 coupled to it. The configurable POR unit 204 also includes a configurable power on reset (POR) logic module 304 for generating a 3D power on reset (POR) output 306.

The configurable power on reset (POR) logic module 304 can be set-up to provide different power schemes, including monitoring power supplies and their levels as well as the critical reset timing in order to reliably turn-on the functions. The configurable power detector module 302 is set-up to monitor the power supply levels.

The 3D POR output 306 is configured to initialize the FPGA die 202 and the heterogeneous integrated circuit die 218. In order to control the timing of the 3D power on reset output 306, an FPGA core 308, an FPGA peripheral unit 310, a configurable interface bus (CIB) 312, or a combination thereof can be configured by an FPGA configuration controller 314. Upon completion of the FPGA configuration, an FPGA configuration done output 316 is asserted and detected by the configurable POR logic module 304.

The CIB 312 can provide the operational communication between the FPGA die 202 and the heterogeneous integrated circuit die 218. An interface bus 318 can allow the function of the heterogeneous integrated circuit die 218 to be controlled by the FPGA die 202. The heterogeneous integrated circuit die 218 can provide a 3D power good output 320 that is coupled to the FPGA die 202 and detected by the configurable POR logic module 304.

The configurable power detector module 302 can generate a bus of raw POR's 322 that is coupled to the configurable POR logic module 304. The bus of the raw POR's 322 can indicate the transition of all of the FPGA source voltages 324 and all of the slave IC source voltages 326 have reached an operational level. In contrast, if any of the FPGA source voltages 324 or any of the slave IC source voltages 326 drops below the operational level, a corresponding bit in the bus of the raw POR's 322 will be asserted in order to assert the 3D power on reset output 306.

The configurable power detector module 302 includes one or more independent detectors, where each detector detects a single power supply to be monitored. The operational threshold for all of the FPGA source voltages 324 and all of the slave IC source voltages 326 can be established through a trip level configuration port 328. In one embodiment the trip level configuration port 328 is configured as the FPGA die 202 is mounted on the base device 206, e.g., by using configuration links 329, such as metal option tieoff at FPGA die level or micro pad tieoff at 3D integration level. In an alternative embodiment, the trip level configuration port 328 is configured by selectively programming fuses after 3D integration. The bus of raw POR's 322 can be managed in accordance with predetermined requirements by configuring a POR logic configuration port 330. In one embodiment the POR logic configuration port 330 is configured as the FPGA die 202 is mounted on the base device 206, e.g., by using the configuration links 329, such as metal option tieoff at FPGA die level or micro pad tieoff at 3D integration level. In an alternative embodiment, the POR logic configuration port 330 is configured by the configuration links 329 that can be selectively programmed fuses after 3D integration. During operation the FPGA core 308 can assert a core reset 332 if a catastrophic error is detected or a host reset command is received. The core reset 332 can be coupled to the configurable POR logic module 304 as an input to 3D power on reset output 306 and an FPGA POR output 334.

The configurable POR unit 204 can monitor one or more of the FPGA source voltages 324 and one or more of the slave IC source voltages 326. It can also be configured to monitor one or more of the heterogeneous integrated circuit die 218.

Figure 4:
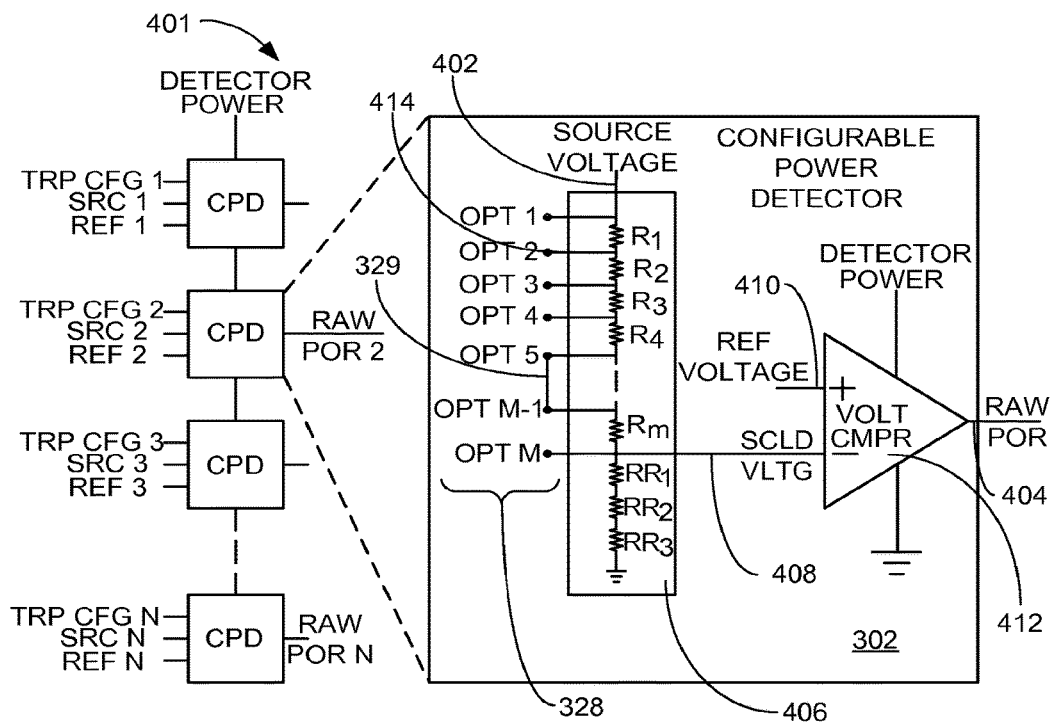
FIG. 4 is a schematic of a configurable power detector in an exemplary embodiment.

Referring now to FIG. 4, therein is shown a schematic of the configurable power detector 401 in an exemplary embodiment. The schematic of the configurable power detector 401 depicts a series of the configurable power detector module 302 each of which is configured to detect the FPGA source voltages 324 of FIG. 3 and the slave IC source voltages 326 of FIG. 3 independently as a source voltage 402, and generate the associated raw POR output 404.

A configurable voltage scaling module 406, such as a series resistor network, for generating a scaled voltage 408 that is compared to a reference voltage 410 by an analog voltage comparator 412. The reference voltage 410 is common across all of the instances of the configurable power detector module 302. Each of the FPGA source voltages 324 and the slave IC source voltages 326 are scaled to compare with the reference voltage 410. The scaling of the FPGA source voltages 324 and the slave IC source voltages 326 is accomplished by configuring the trip level configuration port 328. The configuration of the trip level configuration port 328 can be accomplished at the time of assembly by coupling the appropriate instances of an option tap 414.

The option tap 414 can be coupled to the configuration link 329 in order to remove serial resistors from the configurable voltage scaling module 406. In this way the source voltage 402 can be scaled to be compatible with the reference voltage 410. It is understood that the configuration link 329 can be coupled to as many of the option tap 414 as required to establish the compatible range between the source voltage 402 and the reference voltage 410.

By way of an example, a jumper applied between the option tap 414 for option 1 and the option tap 414 for option 2 effectively removes resistor R1 from the serial resistor network of the configurable voltage scaling module 406. It is understood that while the absolute value of resistors in an integrated circuit can vary by plus or minus 20 percent, the variation of individual resistors in a resistive array can be accurate to within 0.1 percent relative to each other. The accuracy of the resistor ratio provides a high degree of precision for generating the scaled voltage 408.

Figure 5:
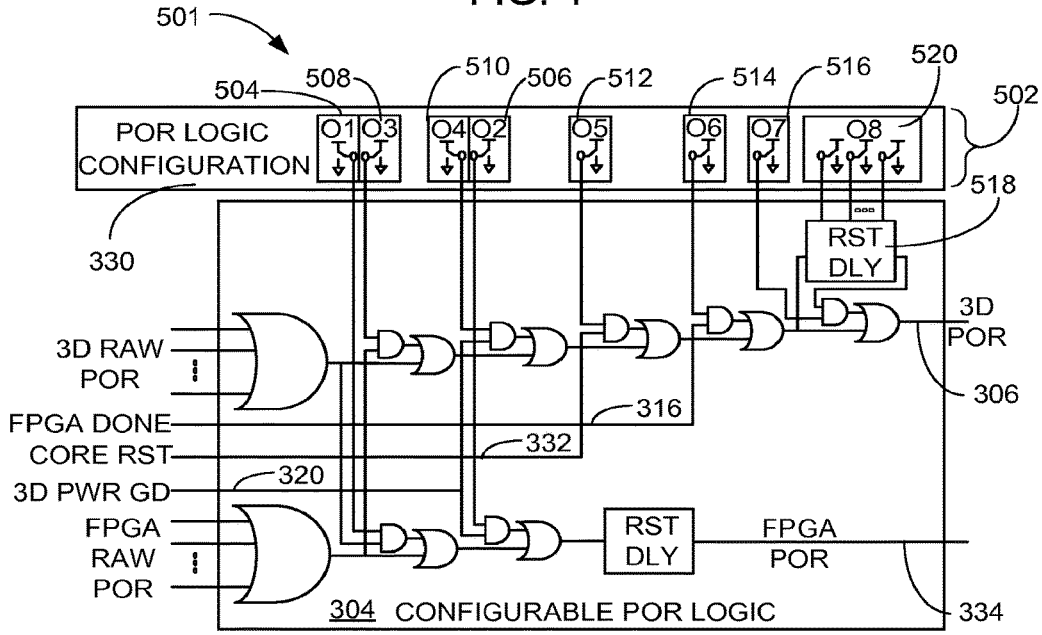
FIG. 5 is a logical block diagram of a configurable POR logic in an exemplary embodiment.

Referring now to FIG. 5, therein is shown a logical block diagram of a configurable POR logic 501 in an exemplary embodiment. The logical block diagram of the configurable POR logic 501 depicts the POR logic configuration port 330 for controlling the configurable POR logic module 304. The POR logic configuration port 330 includes configurable option ports 502 for establishing the conditions under which the 3D power on reset output 306 can be asserted and removed. The configurable option ports 502 are activated by coupling the option select line to a logic high and the configurable option ports 502 are disabled by coupling the option select line to logic low or ground port.

In an exemplary embodiment the configurable POR logic module 304 can implement options such as option one 504 enabled allows the FPGA POR output 334 to be gated by the 3D POR output 306. Option two 506 enabled allows the FPGA POR output 334 to be gated by the 3D power good output 320. Option three 508 enabled allows the 3D POR output 306 to be gated by the FPGA POR output 334. Option four 510 enabled allows the 3D POR output 306 to be gated by the 3D power good output 320. Option five 512 enabled allows the 3D POR output 306 to be gated by the core reset 332. Option six 514 enabled allows the 3D POR output 306 to be gated by the FPGA configuration done output 316. Option seven 516 enabled allows the 3D POR output 306 to be gated by the configurable hard reset delay 518. The option eight 520 is a multi-line configuration port capable of setting a delay in the 3D POR output 306. In the case of no delay required, the option seven 516 is disabled (set to low) the timing of the 3D POR output 306 will not be delayed by this option.

Various combinations of the options described above, (e.g., 504, 506, 508, 510, 512, 514, 516, 518, and 520), as well as other options specified by the FPGA die 202 of FIG. 2 or the heterogeneous integrated circuit die 218 of FIG. 2 are selectively enabled based on the requirements of the FPGA die 202 and the heterogeneous integrated circuit die 218 in the 3D FPGA system. The selectively enabled options of the POR logic configuration port 330 are used for controlling the configurable POR logic module 304. Therefore, the selectively enabled options can be used to determine the order and condition of the assertion and release of the 3D POR output 306 and the FPGA POR output 334. When the configurable POR logic module 304 is used in combination with the configurable power detector module 302, all aspects of the assertion and release of the 3D POR output 306 and the FPGA POR output 334 can be controlled and adjusted to support any of the heterogeneous integrated circuit die 218 by the connections made during the integration of the 3D FPGA system 100 of FIG. 1. In various embodiments these options can be selectively configured by using the configuration links 329, such as metal option tieoff at FPGA die level, by using micro pad tieoff at 3D integration level, or by selectively programming fuses after 3D integration.

It is understood that any of the configurable option ports 502 can be enabled in combination. The duration and timing of the 3D POR output 306 is configurable with high precision.

Figure 6:
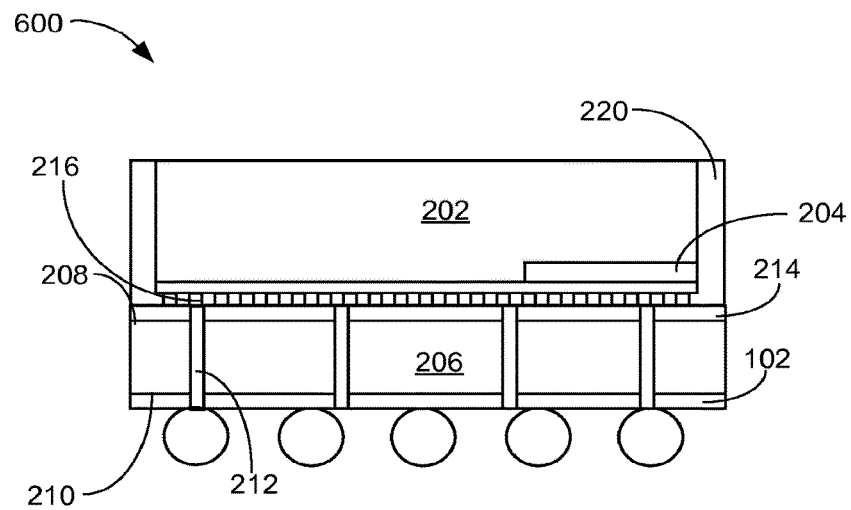
FIG. 6 is a cross-sectional view of the 3D FPGA system along the section line 2-2 of FIG. 1 in a second embodiment of the present invention.

Referring now to FIG. 6, therein is shown a cross-sectional view of the 3D FPGA system 600 along the section line 2-2 of FIG. 1 in a second embodiment of the present invention. The cross-sectional view of the 3D FPGA system 600 depicts the FPGA die 202, having the configurable power on reset (POR) unit 204, mounted on the base device 206. The base device 206 can be a heterogeneous integrated circuit. The base device 206 provides electrical connections on the active side 208 and the backside 210 by way of the through silicon vias (TSV) 212.

The TSV's 212 can couple between the bottom side redistribution layer 102 and the component side redistribution layer 214. It is understood that the orientation of the active side 208 and the backside 210 is an example and can be reversed without changing embodiments of the present invention.

The FPGA die 202 can be coupled to the component side redistribution layer 214 by the micro-bumps 216. The coupling between the FPGA die 202 and a heterogeneous integrated circuit die 218 can be through the micro-bumps 216 and the component side redistribution layer 214. The heterogeneous integrated circuit die 218 is any individual integrated circuit fabricated from the same technology or a different technology from the FPGA die 202. The heterogeneous integrated circuit die 218 can operate as a slave function to the FPGA die 202. The heterogeneous integrated circuit die 218 can provide high speed functions that could not be implemented in the technology of the FPGA die 202.

The package body 220 can be formed on the FPGA die 202, the component side redistribution layer 214, and the heterogeneous integrated circuit die 218. The package body 220 can be formed of an epoxy molding compound, an epoxy resin, silicon sealer, or the like.

It has been discovered that the base device 206 can be an additional function operating under the control of the FPGA die 202. The 3D FPGA system 600 can integrate the FPGA die 202 with one or more of the heterogeneous integrated circuit die 218 while providing an extended function under control of the FPGA die 202. The configurable POR unit 204 of the FPGA die 202 can be configured to provide an appropriate 3D heterogeneous power-on-reset (POR) for all of the integrated functions within the 3D FPGA system 600.

Figure 7:
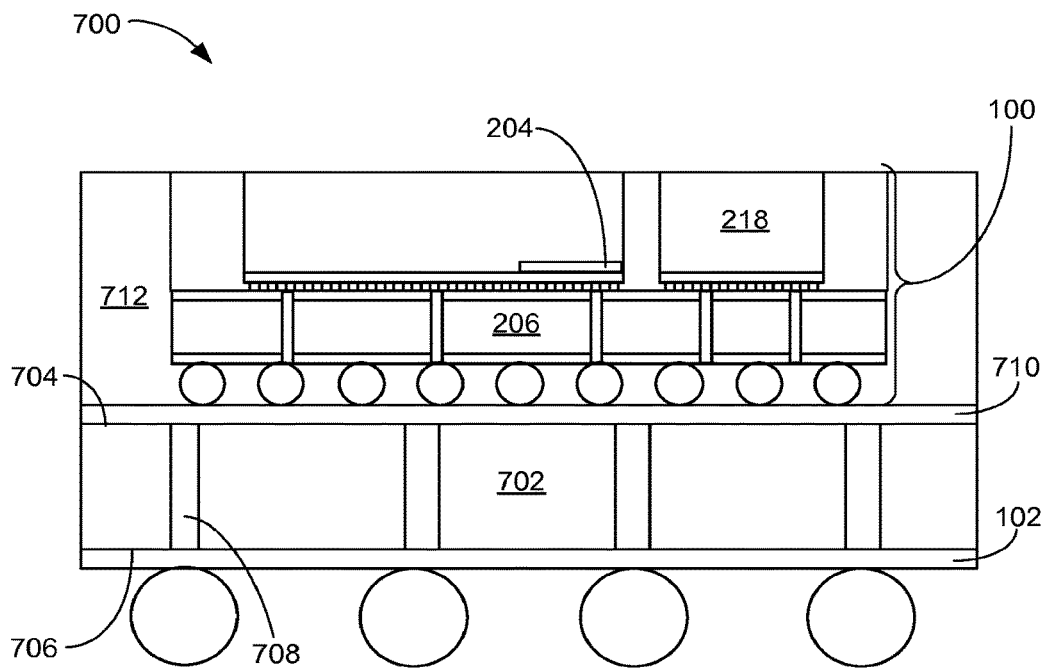
FIG. 7 is a cross-sectional view of the 3D FPGA system along the section line 2-2 of FIG. 1 in a third embodiment of the present invention.

Referring now to FIG. 7, therein is shown a cross-sectional view of the 3D FPGA system 700 along the section line 2-2 of FIG. 1 in a third embodiment of the present invention. The cross-sectional view of the 3D FPGA system 700 depicts the 3D FPGA system 100 mounted on a package base device 702. The package base device 702 provides electrical connections on an active side 704 and a backside 706 by way of through silicon vias (TSV) 708.

The TSV's 708 can provide an electrical connection between the bottom side redistribution layer 102 and a component side redistribution layer 710. It is understood that the orientation of the active side 704 and the backside 706 is an example and can be reversed without changing embodiments of the present invention.

It is understood that the package base device 702 can be a heterogeneous integrated circuit die 702 or a silicon interposer 702. The configurable POR unit 204 can generate the 3D POR output 306 of FIG. 3 for initializing the base device 206, the heterogeneous integrated circuit die 218, and the heterogeneous integrated circuit die 702 based on a customized requirement for the individual devices. A package body 712 can encapsulate the 3D FPGA system 100 and the active side 704.

Thus, it has been discovered that the heterogeneous 3D FPGA systems and devices or products of embodiments of the present invention furnish important and heretofore unknown and unavailable solutions, capabilities, and functional aspects for integrating configurable FPGA based stacked integrated circuit system.

Figure 8:
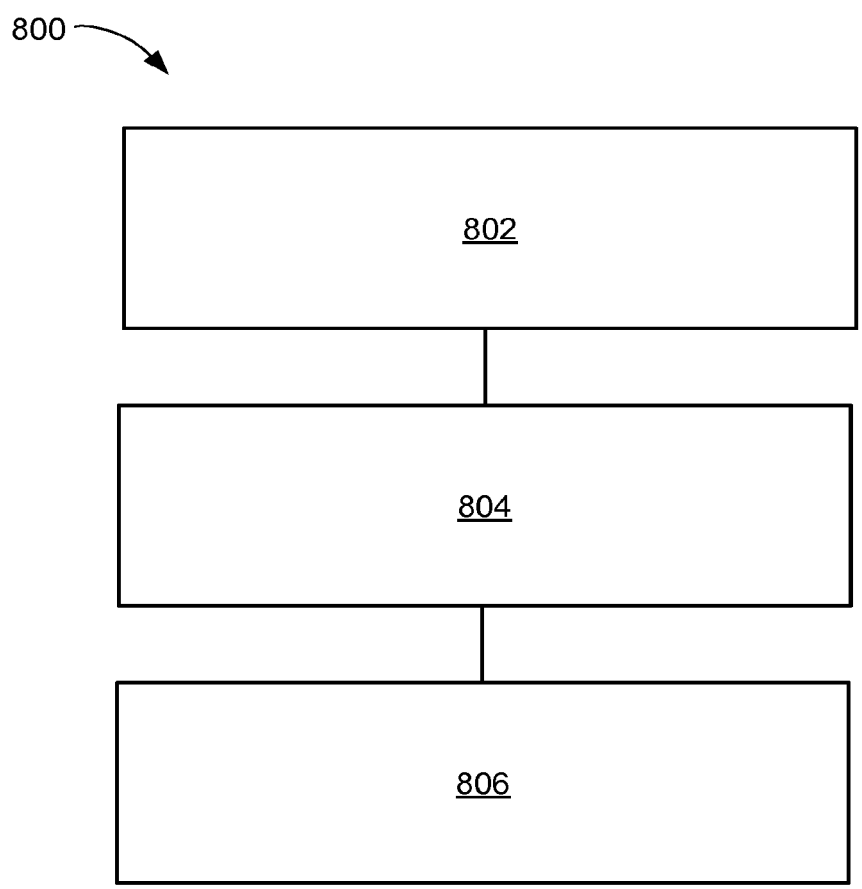
FIG. 8 is a flow chart of a method of manufacture of a 3D FPGA system in a further embodiment of the present invention.

Referring now to FIG. 8, therein is shown a flow chart of a method 800 of manufacture of a 3D FPGA system in a further embodiment of the present invention. The method 800 includes: mounting a field programmable gate array (FPGA) die having a configurable power on reset (POR) unit in a block 802; coupling a heterogeneous integrated circuit die to the FPGA die in a block 804; and configuring a 3D power on reset (POR) output by the configurable POR unit for initializing the FPGA die and the heterogeneous integrated circuit die in a block 806.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing 3D FPGA systems fully compatible with conventional manufacturing methods or processes and technologies. The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package comprising:
a first integrated circuit die that includes a power on reset (POR) unit, wherein the POR unit is a configurable POR unit that is configured to provide different power schemes, and wherein the POR unit comprises a power detector module that monitors power supply levels of the second integrated circuit die;

a second integrated circuit die coupled to the first integrated circuit die;

and a power on reset (POR) output that is controlled by the POR unit and that initializes the first and second integrated circuit dies.

2. The integrated circuit package of claim 1, wherein the first integrated circuit die comprises a programmable integrated circuit die.

3. The integrated circuit package of claim 1, further comprising:

a base device on which the first and second integrated circuit dies are mounted.

4. The integrated circuit package of claim 1, wherein the POR unit comprises a power detector module that monitors power supply levels of the first integrated circuit die.

5. The integrated circuit package of claim 1, wherein the POR unit comprises a power on reset (POR) logic module that generates the POR output.

6. The integrated circuit package of claim 5, wherein the first integrated circuit die includes programmable components, and wherein the POR logic module detects when configuration of the programmable components has completed on the first integrated circuit die.

7. The integrated circuit package of claim 5, wherein the first integrated circuit die further comprises:

core logic circuitry that outputs a core reset signal to the POR logic module in response to detecting an error or a host reset command.

8. The integrated circuit package of claim 1, wherein the POR unit comprises a power detector module and a power on reset (POR) logic module, and wherein the power detector outputs raw power on reset (POR) signals to the POR logic module.

9. An integrated circuit package comprising:

a first integrated circuit die that includes a power on reset (POR) unit; and a second integrated circuit die coupled to the first integrated circuit die, wherein the POR unit of the first integrated circuit die comprises:

a power detector that monitors power supply voltage levels of the first and second integrated circuit dies and that generates corresponding raw power on reset (POR) output signals.

10. The integrated circuit package of claim 9, wherein the power detector comprises a series of configurable power detector modules, each of which outputs a respective one of the raw POR output signals.

11. The integrated circuit package of claim 10, wherein each of the configurable power detector modules comprises:

a series resistor network.

12. The integrated circuit package of claim 11, wherein each of the configurable power detector modules further comprises:

a voltage comparator that receives a scaled voltage from the series resistor network and that also receives a reference voltage.

13. The integrated circuit package of claim 11, wherein each of the configurable power detector modules further comprises:

a configuration link for selectively removing at least one resistor in the series resistor network.

14. An integrated circuit package comprising:

a first integrated circuit die that includes a power on reset (POR) unit; and a second integrated circuit die coupled to the first integrated circuit die, wherein the POR unit of the first integrated circuit die comprises:

power on reset (POR) logic circuitry that generates a power on reset (POR) output for initializing the second integrated circuit die, wherein the POR logic circuitry comprises:

a power on reset (POR) logic module; and a power on reset (POR) logic configuration port that controls the POR logic module and that is programmed using a selected one of programmable fuses and configuration links, wherein the selected one of the programmable fuses and the configuration links set conditions under which the POR output is asserted and removed.

15. The integrated circuit package of claim 14, wherein the POR logic module receives raw power on reset (POR) signals, and wherein the configuration option ports implement gating for at least some of the raw POR signals.

16. The integrated circuit package of claim 14, wherein the configuration option ports implement a desired delay.

* * * * *